United States Patent [19]

Bock et al.

[11] Patent Number: 5,294,601
[45] Date of Patent: Mar. 15, 1994

[54] HIGH-TEMPERATURE SUPERCONDUCTOR COMPRISING BARIUM SULFATE, STRONTIUM SULFATE OR MIXTURES THEREOF AND A PROCESS FOR ITS PREPARATION

[75] Inventors: Joachim Bock; Eberhard Preisler, both of Erftstadt, Fed. Rep. of Germany

[73] Assignee: Hoechst Aktiengesellschaft, Frankfurt am Main

[21] Appl. No.: 911,466

[22] Filed: Jul. 10, 1992

[30] Foreign Application Priority Data

Jul. 26, 1991 [DE] Fed. Rep. of Germany ........ 4124823

[51] Int. Cl.$^5$ .......................... C01F 11/02; C01G 3/02; C01G 29/00; H01L 39/12
[52] U.S. Cl. .......................................... 505/1; 252/518; 252/521; 505/739; 505/782; 505/785
[58] Field of Search ................ 252/518, 521; 505/783, 505/785, 1

[56] References Cited

U.S. PATENT DOCUMENTS

| | | | |
|---|---|---|---|
| 4,880,771 | 11/1989 | Cava | 252/518 |
| 5,047,391 | 9/1991 | Bock et al. | |
| 5,059,581 | 10/1991 | Vasquez | 427/343 |
| 5,087,606 | 2/1992 | Fleischer | 505/785 |
| 5,157,015 | 10/1992 | Snyder | 505/1 |

FOREIGN PATENT DOCUMENTS 0334517 4/1990 European Pat. Off. .
1160861 of 1989 Japan .

OTHER PUBLICATIONS

Hazen "Superconductivity in the High-$T_c$ Bi-Ca-Sr-Cu-O System" *Phys. Rev. Letts* v. 60(12) Mar. 21, 1988 pp. 1174–1177.

Ekin "Transport critical current in bulk sintered $Y_1Ba_2Cu_3O_x$ . . . " *Adv. Cer. Mat'ls* vol. 2(3B) Jul. 1987 pp. 586–592.

Vasquez "Wet chemical techniques for passivation of $YBa_2Cu_3O_x$," *Appl Phys. Letters* v. 55(17) Oct. 23, 1989 pp. 1801–1804.

Derwent Database JP 1160861.

Derwent Database, Week 8931, JP 1 160 861 (Jun. 23, 1989) Abstract only.

*Primary Examiner*—Paul Lieberman
*Assistant Examiner*—John Boyd
*Attorney, Agent, or Firm*—Connolly and Hutz

[57] ABSTRACT

The invention relates to a high-temperature superconductor composed of the oxides of bismuth, strontium, calcium and copper and, optionally, of lead, and having the composition $Bi_{2-a+b+c} Pb_a (Sr, Ca)_{3-b-c} Cu_{2+d} O_x$, where a=0 to 0.7; b+c=0 to 0.5; d=−0.1 to 0.1 and x=7 to 10 and a Sr:Ca ratio of 2.8:1 to 1:2.8 as well as of strontium and/or barium sulfates. Said superconductor can be prepared by intimately mixing the oxides of bismuth, strontium, calcium and copper and optionally of lead with strontium and/or barium sulfates, melting the mixture by heating to temperatures of 870 to 1300° C., higher temperatures being required for higher strontium and/or barium sulfate contents, pouring the melt into molds and allowing it to solidify slowly therein and subjecting the moldings removed from the molds to a heat treatment at temperatures of 700 to 900° C. in an oxygen-containing atmosphere.

13 Claims, No Drawings

HIGH-TEMPERATURE SUPERCONDUCTOR COMPRISING BARIUM SULFATE, STRONTIUM SULFATE OR MIXTURES THEREOF AND A PROCESS FOR ITS PREPARATION

The present invention relates to a high-temperature superconductor composed of the oxides of bismuth, strontium, calcium, copper and, optionally, of lead, and to a process for its preparation.

U.S. Pat. No. 5,047,391 discloses a process for the preparation of a high-temperature superconductor having the composition $Bi_2(Sr,Ca)_3Cu_2O_x$ with values of 8 to 10 for x. In this process stoichiometric mixtures of the oxides or carbonates of bismuth, strontium, calcium and copper are heated to temperatures of 870° to 1100° C. with the formation of a homogeneous melt. This melt is poured into molds and solidifies therein. The castings removed from the molds are heat-treated for 6 to 30 hours at 780° to 850° C. and then treated for at least 6 hours at 600° to 830° C. in an oxygen atmosphere. In this way it is possible to prepare moldings in the form of platelets having an edge length or diameter of up to several cm and in the form of rods up to 50 cm in length and 12 mm in diameter, which moldings in each case is composed of a single phase compound.

There are a number of applications for moldings of the said type in the electrical sector, for example as current conductors for power transmissions, as current limiters and in the form of magnetic shields. The prerequisite for industrial use, however, is that the high-temperature superconductor has a critical current density of about 1000 $A/cm^2$ at the temperature of liquid nitrogen (77K).

It is true that known tapes 1 cm wide and 15 μm thick composed of $Bi_2Sr_2CaCu_2O_x$ on a silver substrate have a critical current density of 10000 $A/cm^2$; however, such tapes can only carry an absolute current of 15 A (cf. "Proceedings of the ICMC '90 Topical Conference on Material Aspects of High-temperature Superconductors", 1991, pages 165 to 176). The absolute currents are even lower in the case of thin films, which, moreover, it has hitherto been possible to produce only in dimensions of a few cm.

Current densities of the order of magnitude of $10^2$ $A/cm^2$ at 77 K have been measured for solid components made of high-temperature superconductor material based on the oxides of bismuth, strontium, calcium and copper.

The aim of the present invention is to provide a high-temperature superconductor based on the oxides of bismuth, strontium, calcium, copper and, optionally, of lead, and a process for its preparation, the high-temperature superconductor having a critical current density of at least 1000 $A/cm^2$ at 77 K and being able to carry an absolute current of at least 100 A. The high-temperature superconductor according to the invention is composed of the oxides of bismuth, strontium, calcium, copper and, optionally, of lead, having the composition $Bi_{2-a+b+c} Pb_a (Sr, Ca)_{3-b-c} Cu_{2+d} O_x$ where a=0 to 0.7; b+c=0 to 0.5; d=−0.1 to 0.1 and x=7 to 10, and a Sr:Ca ratio of 2.8:1 to 1:2.8, as well as of strontium and/or barium sulfates.

The high-temperature superconductor according to the invention can also be further developed in that a) a=0; b+c=0.25; d=0 and x=7.9 to 8.5 and the Sr:Ca ratio is from 2.2:1 to 1.5:1;

b) its strontium sulfate content is 0.1 to 30% by weight, preferably 3 to 10% by weight; and c) its barium sulfate content is 0.1 to 20% by weight, preferably 3 to 10% by weight.

A process for the preparation of the high-temperature superconductor according to the invention can comprise intimately mixing the oxides of bismuth, strontium, calcium and copper and, optionally, of lead, with strontium and/or barium sulfates, melting the mixture by heating to temperatures of 870° to 1300° C., preferably of 900° to 1100° C., higher temperatures being required for higher contents of strontium and/or barium sulfate contents, pouring the melt into molds and allowing it to solidify slowly therein and subjecting the moldings removed from the molds to a heat treatment at temperatures of 700° to 900° C., preferably 750° to 870° C., in an oxygen-containing atmosphere.

This process can also be designed such that d) the melt is poured into a horizontally arranged cylinder rotating about its longitudinal axis;

e) the melt is poured into quartz molds;

f) the melt is poured into copper molds;

g) for the heat treatment, the moldings are heated rapidly at 250° to 350° C./h up to 700° C. and above this temperature are heated slowly at 5° to 20° C./h;

h) the heat treatment is carried out in an atmosphere of air and nitrogen in the ratio by volume of 1:1;

i) the heat treatment is carried out in pure oxygen.

If the high-temperature superconductor according to the invention is composed of a mixture of the so-called 2-layer compound (oxides of bismuth, strontium, calcium and copper in the stoichiometric ratio of the metals of 2:1:2) and strontium sulfate, decomposition products or other phases are not detectable up to a strontium sulfate content of 30% by weight.

On the other hand, the high-temperature superconductor according to the invention which is composed of the so-called 2-layer compound and barium sulfate contains alkaline earth metal cuprate phases, for example (Sr, Ca)CuO$_2$.

Investigations by thermal analysis show that the alkaline earth metal sulfates melt with the oxides of bismuth, strontium, calcium, copper and, optionally, of lead, with the formation of eutectics. The melting points of barium sulfate and strontium sulfate are, specifically, considerably higher at 1580° and 1600° C. respectively.

Finally, ceramographic investigations and photographs taken with the scanning electron microscope show that precipitations of strontium sulfate and barium sulfate in the range of size of 10 to 100 μm are present in the high-temperature superconductors according to the invention.

Surprisingly, it has been found that in the case of the high-temperature superconductors according to the invention the critical temperature not only does not fall but in some cases even rises with increasing content of alkaline earth metal sulfates.

With values of about 1400 $A/cm^2$ at 77 K, the critical current density of the high-temperature superconductor according to the invention is several times higher than that of high-temperature superconductors according to the prior art.

The bending strength and modulus of elasticity of the high-temperature superconductors according to the invention show satisfactory values.

High-temperature superconductors according to the invention can be produced in the form of relatively large moldings, for example rods, plates or cylinders, because they are less brittle and have a lower tendency to form cracks than the moldings according to the prior art. This is the case both during the solidification of the melt and during the heat treatment of the moldings.

EXAMPLE 1 (COMPARISON EXAMPLE)

Binary oxides of bismuth, strontium, calcium and copper in the stoichiometric ratio of the metals of 2:2:1:2 were intensively mixed. 1.8 kg of this mixture were converted into a homogeneous melt in a corundum crucible at 1000° C. The homogeneous melt was poured via a groove into a cylindrical mold 200 mm in diameter and 100 mm deep arranged horizontally and rotating about its longitudinal axis, the melt being uniformly distributed on the wall of the mold as a result of the centrifugal force. In order to facilitate a slower cooling, a tubular furnace preheated to 600° C. was pushed over the mold immediately after casting. The furnace was cooled to room temperature at about 2° C./min. The hollow cylinder present in the mold after the tubular furnace had cooled had two vertical cracks opposite to one another, presumably caused by severe inherent stresses, and broke into two parts on removal from the mold.

EXAMPLE 2 (COMPARISON EXAMPLE)

Example 1 was repeated except that only 1.5 kg of mixture were converted into a homogeneous melt. The hollow cylinder removed from the mold after the tubular furnace had cooled had, in each case, two transverse cracks about 1 cm long opposite one another on its upper and lower edge.

The hollow cylinder was subjected to a heat treatment (24 hours at 750° C.; 120 hours at 850° C.). Following this treatment longitudinal cracks had also formed at the ends of the transverse cracks and these resulted in individual ring segments breaking away.

EXAMPLE 3 (ACCORDING TO THE INVENTION)

Example 1 was repeated except that the binary oxides were intensively mixed together with 10% by weight of strontium sulfate and that 2 kg of this mixture were converted into a homogeneous melt by heating to 1050° C. A sturdy, crack-free hollow cylinder with a wall thickness of about 5 mm was removed from the mold. The hollow cylinder was subjected to a heat treatment 24 hours at 750° C.; 120 hours at 850° C.). Even after this treatment the hollow cylinder was crack-free and showed no melting-out whatsoever.

EXAMPLE 4 (ACCORDING TO THE INVENTION)

A mixture according to Example 3 was melted and poured into quartz tubes closed on one side (internal diameter: 8 mm) which had lengths of 100, 150, 200, 300 and 500 mm.

After cooling to room temperature, it was possible to remove the solidified melts from all quartz tubes in the form of compact rods without visible cracks.

The rods were heated in an air/nitrogen mixture (ratio by volume 1:1) at rates of 300° C./h to 700° C. and at 10° C./h to 850° C. and left at this temperature for 60 hours. In order to ensure as homogeneous as possible a temperature field, the heat treatment was carried out in a multi-zone tubular furnace.

All of the rods removed from the furnace after cooling were crack-free.

The 200 mm long rod was provided with contacts and the critical current density at 77 K was determined as 570 A/cm$^2$ (criterion: 1 $\mu$V/cm) with the aid of a four-point measurement, the clearance between the voltage contacts being 13 cm.

The temperature-dependent determination of the resistance gave the total loss of resistance as 89.5 K.

EXAMPLE 5 (COMPARISON EXAMPLE)

A mixture according to Example 1 was melted and poured into the various quartz tubes according to Example 4 which are closed on one side.

After cooling to room temperature, it was possible to remove a compact rod only from the 100 and 150 mm long quartz tubes, whereas the other quartz tubes contained only fragments.

EXAMPLE 6 (ACCORDING TO THE INVENTION)

Binary oxides of bismuth, strontium, calcium and copper in the stoichiometric ratio of the metals of 2:2:1:2 were intensively mixed with various amounts of strontium sulfate (0, 3, 6, 10, 15, 20, 25 and 30 % by weight). The various mixtures were converted into homogeneous melts in a corundum crucible at 1000° C. (up to 10% SrSO ), 1030° C. (up to 20% SrSO$_4$) and 1100° C. (up to 30% SrSO$_4$) and each melt was poured into rectangular copper molds having dimensions of 15×15×60 mm$^3$, which were open at the top. Cooling of the melt was slowed down by placing the molds, immediately after casting, in a chamber furnace preheated to 600° C., which was then switched off. Disk-shaped samples each 4 mm thick and rods having dimensions of 45×4×3 mm$^3$ were cut from the resulting moldings using a diamond cutting wheel. All samples and rods were heat-treated together in air for 24 hours at 850° C. in a chamber furnace.

Rods 1 mm$^2$ in cross section and about 10 mm long were sawn from the disk-shaped samples. The transition temperatures Tc and the critical current density jc were determined on these rods, whilst the rods having dimensions of 45×4×3 mm$^3$ were used to determine the bending strength and the modulus of elasticity (Young's modulus).

The results are summarized in the following table:

| % by weight of SrSO$_4$ | Tc [K] | R = 0 [K] | jc [A/cm$^2$] | Bending strength [MPa] | Young's modulus [GPa] |
|---|---|---|---|---|---|
| 0 | 88 | 88.5 | 84 | 27 | 31 |
| 3 | 93 | 89.5 | 1386 | 28 | 35 |
| 6 | 92 | 89.5 | 1102 | 25 | 32 |
| 10 | 92 | 89.5 | 608 | 30 | 36 |
| 15 | 93 | 88.5 | 623 | 33 | 43 |
| 20 | 92 | 88.5 | 307 | 31 | 39 |
| 30 | 92 | 89 | 124 | | |

EXAMPLE 7 (ACCORDING TO THE INVENTION)

Example 6 was repeated except that barium sulfate was used in place of strontium sulfate.

The results are summarized in the following table:

| % by weight of BaSO$_4$ | Tc [K] | R = 0 [K] | jc [A/cm$^2$] |
| --- | --- | --- | --- |
| 0 | 91 | 88 | 101 |
| 3 | 95 | 91.5 | 629 |
| 6 | 94 | 91 | 570 |
| 10 | 93 | 90.5 | 309 |
| 15 | 87 | 83.5 | 136 |
| 20 | 86 | 83.5 | 75 |

EXAMPLE 8 (COMPARISON EXAMPLE)

Example 6 was repeated except that calcium sulfate (anhydrous) was used in place of strontium sulfate.

The results are summarized in the following table:

| % by weight of CaSO$_4$ | Tc [K] | R = 0 [K] | jc [A/cm$^2$] |
| --- | --- | --- | --- |
| 0 | 88 | 85.5 | 96 |
| 0.7 | 89 | 86.5 | 159 |
| 2.2 | 91 | 88.5 | 56 |
| 4.4 | 89 | 86.5 | 1 |
| 7.4 | 85 | 82.5 | <1 |
| 11.1 | 82 | 67 | <1 |

A number of foreign phases are already discernable in the X-ray diagram, in addition to the so-called two-layer compound, from 4.4% by weight of CaSO$_4$ upwards.

We claim:

1. A composition comprising (1) a high-temperature superconductor composed of the oxides of bismuth, strontium, calcium, copper and lead, having the composition Bi$_{2-a+b+c}$ Pb$_a$ (Sr,Ca)$_{3-b-c}$ Cu$_{2+d}$ O$_x$ where a=O to 0.7; b+c=O to 0.5; d= −0.1 to 0.1 and x=7 to 10, and a Sr:Ca ratio of 2.8:1 to 1:2.8, and (2) sulfates selected from the group consisting of strontium sulfate, barium sulfate and mixtures thereof, wherein the strontium sulfate content is 3 to 30% by weight when present in the composition and wherein its barium sulfate content is 3 to 20% by weight when present in the composition.

2. The high-temperature superconductor as claimed in claim 1, wherein a=0; b+c=0.25; d=0 and x=7.9 to 8.5 and the Sr:Ca ratio is from 2.2:1 to 1.5:1.

3. The high-temperature superconductor as claimed in claim 1, wherein its strontium sulfate content is 3 to 10% by weight.

4. The high-temperature superconductor as claimed in claim 1, wherein its barium sulfate content is 3 to 10% by weight.

5. A process for the preparation of a high-temperature superconductor as claimed in claim 1, which comprises intimately mixing the oxides of bismuth, strontium, calcium, copper and lead with sulfates selected from the group consisting of strontium sulfate, barium sulfate and mixtures thereof, melting the mixture by heating to temperatures of 870° to 1300° C., higher temperatures being required for higher contents of strontium sulfate, barium sulfate and mixtures thereof, pouring the melts into molds and allowing it to solidify slowly therein and subjecting the moldings removed from the molds to a heat treatment at temperatures of 700° to 900° C. in an oxygen-containing atmosphere.

6. The process as claimed in claim 5, wherein the mixture is melted by heating to temperatures of 900° to 1100° C.

7. The process as claimed in claim 5, wherein the moldings are subjected to a heat treatment at temperatures of 750° to 870° C.

8. The process as claimed in claim 5, wherein the melt is poured into a horizontally arranged cylinder rotating about its longitudinal axis.

9. The process as claimed in claim 5, wherein the melt is poured into quartz molds.

10. The process as claimed in claim 5, wherein the melt is poured into copper molds.

11. The process as claimed in claim 5, wherein, for the heat treatment, the moldings are heated rapidly at 250° to 350° C./h up to 700° C. and above this temperature are heated slowly at 5° to 20° C./h.

12. The process as claimed in claim 5, wherein the heat treatment is carried out in an atmosphere of air and nitrogen in the ratio by volume of 1:1.

13. The process as claimed in claim 5, wherein the heat treatment is carried out in pure oxygen.

* * * * *